US012628460B2

(12) United States Patent
Hamano et al.

(10) Patent No.: US 12,628,460 B2
(45) Date of Patent: May 12, 2026

(54) PHOTOELECTRIC CONVERSION ELEMENT AND METHOD FOR MANUFACTURING PHOTOELECTRIC CONVERSION ELEMENT

(71) Applicant: IDEMITSU KOSAN CO., LTD., Tokyo (JP)

(72) Inventors: Mikio Hamano, Tokyo (JP); Kyohei Horiguchi, Tokyo (JP); Takato Ishiuchi, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 18/574,096

(22) PCT Filed: Jun. 20, 2022

(86) PCT No.: PCT/JP2022/024546
§ 371 (c)(1),
(2) Date: Dec. 26, 2023

(87) PCT Pub. No.: WO2023/276759
PCT Pub. Date: Jan. 5, 2023

(65) Prior Publication Data
US 2024/0290896 A1     Aug. 29, 2024

(30) Foreign Application Priority Data
Jun. 28, 2021    (JP) ................................. 2021-107135

(51) Int. Cl.
*H10F 77/20*          (2025.01)
(52) U.S. Cl.
CPC ......... *H10F 77/215* (2025.01); *H10F 77/244* (2025.01); *H10F 77/247* (2025.01); *H10F 77/251* (2025.01)

(58) Field of Classification Search
CPC .... H10F 77/215; H10F 77/244; H10F 77/247; H10F 77/251; Y02E 10/541
See application file for complete search history.

(56) References Cited

U.S. PATENT DOCUMENTS

| | | | |
|---|---|---|---|
| 4,936,924 A | 6/1990 | Inuzuka | |
| 5,330,583 A | 7/1994 | Asai et al. | |
| (Continued) | | | |

FOREIGN PATENT DOCUMENTS

| | | | | |
|---|---|---|---|---|
| CN | 105857643 A | * | 8/2016 | .............. B64G 1/44 |
| JP | S64-50475 A | | 2/1989 | |
| (Continued) | | | | |

OTHER PUBLICATIONS

Dhere ("Present status and future prospects of CIGSS thin film solar cells"), Solar Energy Materials & Solar Cells 90 (2006) 2181-2190 (Year: 2006).*

(Continued)

*Primary Examiner* — Angelo Trivisonno
(74) *Attorney, Agent, or Firm* — Foley & Lardner LLP

(57) ABSTRACT

Provided is a photoelectric conversion element capable of suppressing a decrease in strength. A photoelectric conversion element comprises: a photoelectric conversion layer (26); an electrode layer (24) adjacent to the photoelectric conversion layer; a collecting electrode (30) adjacent to the electrode layer; and a conductor (50) joined to the collecting electrode. The thickness of the collecting electrode (30) at least at a joint portion between the collecting electrode (30) and the conductor (50) is 4 μm or more.

14 Claims, 5 Drawing Sheets

(56) References Cited

U.S. PATENT DOCUMENTS

| | | | |
|---|---|---|---|
| 2005/0039792 A1 | 2/2005 | Takahashi et al. | |
| 2009/0038671 A1 | 2/2009 | Yamaguchi | |
| 2011/0094567 A1* | 4/2011 | Lee | H10F 77/215 |
| | | | 257/E31.127 |
| 2013/0220540 A1 | 8/2013 | Fukushima et al. | |
| 2014/0193941 A1 | 7/2014 | Kim et al. | |
| 2015/0000720 A1* | 1/2015 | DeGroot | H10F 19/904 |
| | | | 136/244 |
| 2015/0136216 A1* | 5/2015 | Kurihara | H10F 77/128 |
| | | | 136/256 |
| 2015/0179839 A1 | 6/2015 | Van Duren et al. | |

FOREIGN PATENT DOCUMENTS

| | | | |
|---|---|---|---|
| JP | H05-160425 A | 6/1993 |
| JP | H09-17823 A | 1/1997 |
| JP | H09-237911 A | 9/1997 |
| JP | 2004-193317 A | 7/2004 |
| JP | 2005-244159 A | 9/2005 |
| JP | 2005-268466 A | 9/2005 |
| JP | 2008-153429 A | 7/2008 |
| JP | 2009-044049 A | 2/2009 |
| JP | 2010-199173 A | 9/2010 |
| JP | 2011-243721 A | 12/2011 |
| JP | 2014-135486 A | 7/2014 |
| JP | 2014-229747 A | 12/2014 |
| JP | 2016-100458 A | 5/2016 |
| JP | 2021-082819 A | 5/2021 |

OTHER PUBLICATIONS

English machine translation of CN-105857643-A (Year: 2025).*

Lin ("Impact of Mo barrier layer on the formation of MoSe2 in Cu(In,Ga)Se2 solar cells") Journal of Alloys and Compounds 661 (2016) 168-175 (Year: 2016).*

International Searching Authority, "International Search Report," issued in connection with International Patent Application No. PCT/JP2022/024546, dated Aug. 2, 2022.

International Searching Authority, "Written Opinion," issued in connection with International Patent Application No. PCT/JP2022/024546, dated Aug. 2, 2022.

European Extended Search Report issued in corresponding European Patent Application No. 22832907.4 dated May 19, 2025.

Office Action issued in corresponding Japanese Patent Application No. 2023-531822 dated Jul. 29, 2025.

Office Action issued in corresponding Japanese Patent No. 2023-531822 dated Nov. 4, 2025.

* cited by examiner

Ratio of Tensile Strength

Thickness of Collecting Electrode ($\mu$m)

PHOTOELECTRIC CONVERSION ELEMENT AND METHOD FOR MANUFACTURING PHOTOELECTRIC CONVERSION ELEMENT

CROSS-REFERENCE TO RELATED APPLICATIONS

The present application claims priority under 35 U.S.C. § 371 to International Patent Application No. PCT/JP2022/024546, filed Jun. 20, 2022, which claims priority to and the benefit of Japanese Patent Application No. 2021-107135, filed on Jun. 28, 2021. The contents of these applications are hereby incorporated by reference in their entireties.

TECHNICAL FIELD

The present invention relates to a photoelectric conversion element and a method for manufacturing the photoelectric conversion element.

BACKGROUND ART

A photoelectric conversion element that converts light energy into electric energy is known (Patent Literature 1). In the photoelectric conversion element described in Patent Literature 1, a collecting electrode is attached on a photovoltaic element having a multilayer structure.

In addition, the photoelectric conversion element described in Patent Literature 1 includes a round as a connection terminal portion disposed at an end portion of the collecting electrode, and a relay terminal portion provided for electrical connection with the outside. The round and the relay terminal portion are electrically connected by a connection lead.

CITATION LIST

Patent Literature

Patent Literature 1: JP H09-237911 A

SUMMARY

The inventors of the present application found a problem that a layer and a wiring which constitute a photoelectric conversion element may be peeled off by a force pulled from a wiring joined to a collecting electrode. When such peeling occurs, the photoelectric conversion efficiency of the photoelectric conversion element may decrease, or the photoelectric conversion function may be lost.

Therefore, a photoelectric conversion element capable of suppressing a decrease in strength and a method for manufacturing such the photoelectric conversion element are desired.

A photoelectric conversion element according to one aspect comprises: a photoelectric conversion layer; an electrode layer adjacent to the photoelectric conversion layer; a collecting electrode adjacent to the electrode layer; and a conductor joined to the collecting electrode. A thickness of the collecting electrode at least at a joint portion between the collecting electrode and the conductor is 4 μm or more.

A method for manufacturing a photoelectric conversion element according to one aspect comprises: a step of forming a photoelectric conversion layer; a step of forming an electrode layer adjacent to the photoelectric conversion layer; a step of forming a collecting electrode adjacent to the electrode layer; and a step of joining a conductor to the collecting electrode. A thickness of the collecting electrode at least at a joint portion between the collecting electrode and the conductor is 4 μm or more.

DESCRIPTION OF EMBODIMENTS

Figure 1:
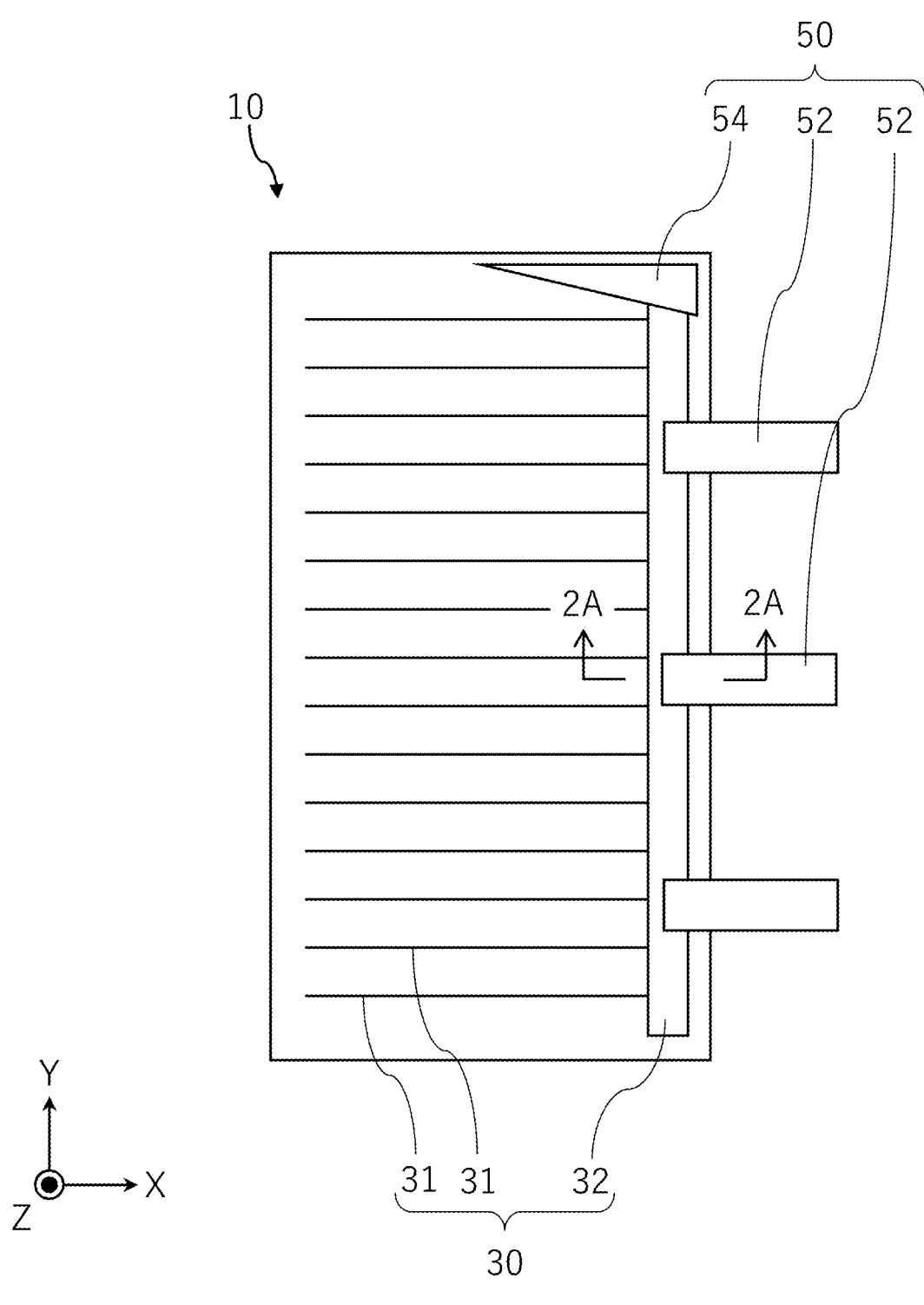
FIG. 1 is a schematic plan view of a photoelectric conversion element according to an embodiment.

Hereinafter, embodiments will be described with reference to the drawings. In the following drawings, the same or similar parts are denoted by the same or similar reference numerals. However, it should be noted that the drawings are schematic, and ratios of dimensions and the like may be different from actual ones.

Figure 2:
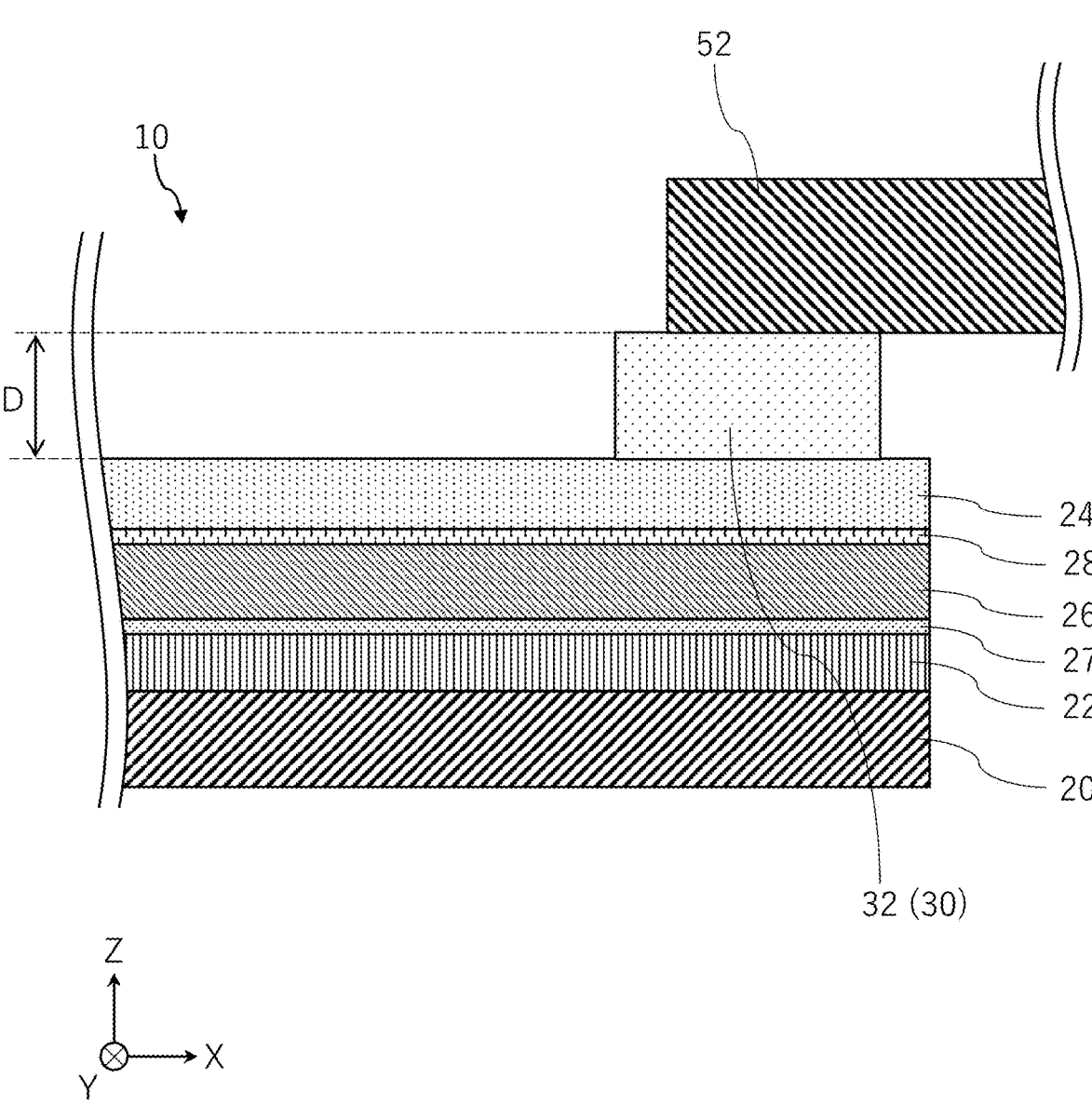
FIG. 2 is a schematic cross-sectional view of the photoelectric conversion element taken along line 2A-2A in FIG. 1.

FIG. 1 is a schematic plan view of a photoelectric conversion element according to an embodiment. FIG. 2 is a schematic cross-sectional view of the photoelectric conversion element taken along line 2A-2A in FIG. 1.

A photoelectric conversion element 10 according to the present embodiment may be a photoelectric conversion element of a thin film type. Preferably, the photoelectric conversion element 10 is a solar cell element that converts light energy into electrical energy.

The photoelectric conversion element 10 includes a substrate 20 serving as a base on which each film is formed. A substrate 20 may be constructed by, for example, glass, ceramics, resin, metal, or the like. The substrate 20 may be a flexible substrate. A shape and dimensions of the substrate 20 are appropriately determined depending on a size and the like of the photoelectric conversion element 10.

When a metal substrate is adopted as the substrate 20, the substrate 20 is formed of, for example, titanium (Ti), stainless steel (SUS), copper, aluminum, an alloy thereof, or the like. Alternatively, the substrate 20 may have a laminated structure in which a plurality of metal substrates are laminated, and for example, a stainless foil, a titanium foil, or a molybdenum foil may be formed on a surface of the substrate.

When the substrate 20 is a flexible metal substrate, a solar cell 10 can be bent, and cracking of the substrate 20 due to bending can also be suppressed. Furthermore, in the above case, it is easy to reduce weight and thickness of the solar cell 10 as compared with a glass substrate.

The photoelectric conversion element 10 may include at least a first electrode layer 22, a second electrode layer 24, and a photoelectric conversion layer 26 provided between the first electrode layer 22 and the second electrode layer 24. The photoelectric conversion layer 26 is a layer that contributes to mutual conversion between light energy and electric energy. In a solar cell element that converts light energy into electric energy, the photoelectric conversion layer 26 may be referred to as a light absorption layer.

The first electrode layer 22 and the second electrode layer 24 are adjacent to the photoelectric conversion layer 26. In the present description, the term "adjacent" shall mean not only that both layers are in direct contact but also that both layers are in proximity via another layer.

The first electrode layer 22 is provided between the photoelectric conversion layer 26 and the substrate 20. The second electrode layer 24 is located on a side opposite to the substrate 20 with respect to the photoelectric conversion layer 26. Therefore, the first electrode layer 22 is located on a side opposite to the second electrode layer 24 with respect to the photoelectric conversion layer 26.

In the present embodiment, the second electrode layer 24 may be constituted by a transparent electrode layer. When the second electrode layer 24 is constituted by a transparent electrode layer, light incident on the photoelectric conversion layer 26 or emitted from the photoelectric conversion layer 26 passes through the second electrode layer 24.

When the second electrode layer 24 is constituted by a transparent electrode layer, the first electrode layer 22 may be constituted by an opaque electrode layer or may be constituted by a transparent electrode layer. The first electrode layer 22 may be formed of, for example, a metal such as molybdenum, titanium, or chromium. Although not particularly limited, a thickness of the first electrode layer 22 may be, for example, 50 nm to 1500 nm.

In the present embodiment, as a preferred example, the second electrode layer 24 may be formed of an n-type semiconductor, more specifically, a material having n-type conductivity and relatively low resistance. The second electrode layer 24 can function as both an n-type semiconductor and a transparent electrode layer. The second electrode layer 24 includes, for example, a metal oxide to which a group III element (B, Al, Ga, or In) is added as a dopant. Examples of the metal oxide include Zno and $SnO_2$. The second electrode layer 24 can be selected from, for example, indium tin oxide ($In_2O_3$:Sn), indium titanium oxide ($In_2O_3$:Ti), indium zinc oxide ($In_2O_3$:Zn), tin-zinc-doped indium oxide ($In_2O_3$:Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), gallium-doped zinc oxide (ZnO:Ga), boron-doped zinc oxide (ZnO:B), aluminum-doped zinc oxide (ZnO:Al), and the like.

Although not particularly limited, a thickness of the second electrode layer 24 is, for example, 0.5 μm to 2.5 μm.

The photoelectric conversion layer 26 may include, for example, a p-type semiconductor. In a specific example, the photoelectric conversion layer 26 may function as, for example, a p-type compound semiconductor layer of polycrystalline or microcrystalline. Although not particularly limited, a thickness of the photoelectric conversion layer 26 is, for example, 1.0 μm to 3.0 μm.

In a specific example, the photoelectric conversion layer 26 comprises a chalcogen semiconductor containing a chalcogen element, and functions as a polycrystalline or microcrystalline p-type compound semiconductor layer. The photoelectric conversion layer 26 is constructed by, for example, a group $I-III-VI_2$ compound semiconductor having a chalcopyrite structure containing a group I element, a group III element, and a group VI element (chalcogen element). Here, the group I element can be selected from copper (Cu), silver (Ag), gold (Au), and the like. The group III element can be selected from indium (In), gallium (Ga), aluminum (Al), and the like. Furthermore, the photoelectric conversion layer 26 may contain, as a group VI element, tellurium (Te) or the like in addition to selenium (Se) and sulfur (S). The photoelectric conversion layer 26 may contain an alkali metal such as Li, Na, K, Rb, or Cs.

Alternatively, the photoelectric conversion layer 26 may be constituted of a group $I_2$-(II-IV)-$VI_4$ compound semiconductor which is a CZTS-based chalcogen semiconductor containing Cu, Zn, Sn, S, or Se. Representative examples of the CZTS-based chalcogen semiconductor include those using a compound such as $Cu_2ZnSnSe_4$ or $Cu_2ZnSn(S,Se)_4$.

The photoelectric conversion layer 26 is not limited to those described above, and may be constructed by any material that causes photoelectric conversion.

The photoelectric conversion element 10 may optionally have a first buffer layer 27 between the photoelectric conversion layer 26 and the first electrode layer 22. In this case, the first buffer layer 27 may be a semiconductor material having the same conductivity type as the first electrode layer 22, or may be a semiconductor material having a different conductivity type. The first buffer layer 27 may be constructed by a material having higher electric resistance than that of the first electrode layer 22.

The first buffer layer 27 is not particularly limited, but may be, for example, a layer containing a chalcogenide compound of a transition metal element having a layered structure. Specifically, the first buffer layer 27 may be constructed by a transition metal material such as Mo, W, Ti, V, Cr, Nb, or Ta, and a compound including a chalcogen element such as O, S, or Se. The first buffer layer 27 may be, for example, $Mo(Se,S)_2$ layer, $MoSe_2$ layer, $MoS_2$ layer, $Cr_xTaS_2$ layer, or the like. The layer having the above-described layered structure is a layer having cleavability. The layer having cleavability may be a layer having a hexagonal crystal structure. A layer containing a chalcogenide compound as the first buffer layer 27 can be formed on a surface of the first electrode layer 22 when a precursor layer is chalcogenized to form the photoelectric conversion layer 26.

The photoelectric conversion element 10 may have, as necessary, a second buffer layer 28 between the photoelectric conversion layer 26 and the second electrode layer 24. In this case, the second buffer layer 28 may be a semiconductor material having the same conductivity type as the second electrode layer 24, or may be a semiconductor material having a different conductivity type. The second buffer layer 28 may be constructed by a material having higher electric resistance than that of the second electrode layer 24.

The photoelectric conversion element 10 is formed on the photoelectric conversion layer 26. Although not particularly limited, a thickness of the second buffer layer 28 is, for example, 10 nm to 100 nm.

The second buffer layer 28 can be selected from compounds containing zinc (Zn), cadmium (Cd), and indium (In). Examples of the compound containing zinc include, for example, ZnO, ZnS, $Zn(OH)_2$, or Zn(O,S) and Zn(O,S,OH) which are mixed crystals thereof, and further include ZnMgO, ZnSnO, and the like. Examples of the compound containing cadmium include, for example, CdS, CdO, and Cd(O,S), or Cd(O,S,OH) which are mixed crystals thereof. Examples of the compound containing indium include, for example, InS, InO, or In(O,S) and In(O,S,OH) which are mixed crystals thereof, and $In_2O_3$, $In_2S_3$, $In(OH)_x$, and the like can be used. In addition, the second buffer layer 28 may have a laminated structure of these compounds.

Note that the second buffer layer 28 has an effect of improving characteristics such as photoelectric conversion efficiency, but this can be omitted. When the second buffer layer 28 is omitted, the second electrode layer 24 is formed directly on the photoelectric conversion layer 26.

It should be noted that the laminated structure of the photoelectric conversion element 10 is not limited to the above aspect, and may have any of various aspects. For example, the photoelectric conversion element 10 may have a configuration in which both the n-type semiconductor and the p-type semiconductor are sandwiched between the first electrode layer and the second electrode layer. In this case, the second electrode layer need not be constituted by an n-type semiconductor. In addition, the photoelectric conversion element 10 is not limited to the p-n junction type structure, and may have a p-i-n junction type structure including an intrinsic semiconductor layer (i-type semiconductor) between an n-type semiconductor and a p-type semiconductor.

The photoelectric conversion element 10 includes a collecting electrode 30 adjacent to the second electrode layer 24. The collecting electrode 30 collects charge carriers from the second electrode layer 24, and is formed of a conductive material. The collecting electrode 30 may be in direct contact with the second electrode layer 24. From the viewpoint of improving the power generation efficiency, an area of the collecting electrode 30 is preferably as small as possible.

The collecting electrode 30 may have a plurality of first portions 31 that has substantially line-like shape and a second portion 32 connected to the first portion 31. The first portion 31 may be referred to as a "finger". The second portion 32 may be referred to as a "bus bar".

The first portions 31 are arranged at intervals each other. The plurality of line-like first portions 31 are connected to the second portion 32. The first portion 31 has a function of guiding electricity generated in the photoelectric conversion layer 26 to the second portion 32.

In the illustrated aspect, the substantially line-like first portion 31 extends straight along one direction (X direction in the drawing). Alternatively, the first portion 31 may extend in a wavy line shape or a zigzag polygonal line shape. In the present specification, the term "line-like" is defined by a concept including not only a straight line but also an elongated curved line such as a wavy line or a polygonal line.

A plurality of the first portions 31 of the collecting electrode 30 may be provided side by side in the first direction (Y direction in the drawing). The plurality of line-like first portions 31 may be connected to the same second portion 32.

The second portion 32 of the collecting electrode 30 may extend in a first direction (Y direction in the drawing). The second portion 32 may be connected to the first portion 31 at an end portion of the first portion 31. In this case, the plurality of first portions 31 may extend from the second portion 32 along the second direction (X direction in the drawing). Note that the second direction is a direction intersecting the above-described first direction.

The second portion 32 of the collecting electrode 30 may extend from substantially the vicinity of one end to the vicinity of the other end of the photoelectric conversion element 10 in the first direction (Y direction in the drawing). The width (width in the X direction in the drawing) of the second portion 32 of the collecting electrode 30 may be larger than the width (width in the Y direction in the drawing) of each of the first portions 31.

The collecting electrode 30 (the first portion 31 and the second portion 32) may be constructed by a material having higher conductivity than that of the material constituting the second electrode layer 24. As a material constituting the collecting electrode 30 (the first portion 31 and the second portion 32), a material that has good conductivity and can obtain high adhesion to the second electrode layer 24 is applied. For example, the material constituting the collecting electrode 30 can be selected from at least one of indium tin oxide ($In_2O_3$:Sn), indium titanium oxide ($In_2O_3$:Ti), indium zinc oxide ($In_2O_3$:Zn), tin-zinc-doped indium oxide ($In_2O_3$: Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), aluminum-doped zinc oxide (ZnO:Al), boron-doped zinc oxide (ZnO:B), gallium-doped zinc oxide (ZnO:Ga), Ni, Ti, Cr, Mo, Al, Ag, and Cu, or compound containing one or more thereof, and the like. The collecting electrode 30 may be constructed by an alloy or a laminated body comprising a combination of the above-described materials.

The photoelectric conversion element 10 includes a wiring 50 joined to the collecting electrode 30. The wiring 50 may be joined to the second portion 32 of the collecting electrode 30. The wiring 50 may include, for example, an interconnector 52 for electrically connecting to the outside of the photoelectric conversion element 10 and/or a connector 54 for coupling with a bypass diode for electrically bypassing a cell that cannot perform photoelectric conversion.

A plurality of interconnectors 52 may be arranged on the second portion 32 of the collecting electrode 30 at intervals from each other. The interconnector 52 may be, for example, a ribbon wire of a conductive metal containing Ag. Although not particularly limited, the interconnector 52 may have a strip shape having a thickness of about 30 μm and a width of about 2.5 mm.

A joint portion between the collecting electrode 30 and the wiring 50, particularly a joint portion between the collecting electrode 30 and the interconnector 52 may be provided at a position overlapping the photoelectric conversion layer 26 when viewed from a direction orthogonal to the interface of the photoelectric conversion layer 26 (see FIG. 2).

A thickness D of the collecting electrode 30 at least at the joint portion between the collecting electrode 30 and the wiring 50 may be, for example, 4 μm or more, preferably 5 μm or more, more preferably 5.7 μm or more, still more preferably 12 μm or more, and most preferably 14 μm or more. More preferably, the thickness D of the collecting electrode 30 may be 17 μm or more. This makes it possible to suppress a decrease in a strength of the photoelectric conversion element 10 as described in detail below. In particular, even if the photoelectric conversion element 10 includes, for example, a layer having cleavability as described above, it is possible to suppress peeling at a layer having cleavability due to a tensile force.

In addition, the thickness D of the collecting electrode 30 at least at the joint portion between the collecting electrode 30 and the wiring 50 may be, for example, 50 μm or less, and preferably 30 μm or less.

Joining of the wiring 50 to the collecting electrode 30 can be performed by, for example, melt joining, liquid phase joining, solid phase joining (friction stir welding), or the like. Note that heat is generated at the time of joining in any joining method.

Next, a method for manufacturing a solar cell of an embodiment will be described. First, the first electrode layer 22, the first buffer layer 27, the photoelectric conversion layer 26, the second buffer layer 28, and the second electrode layer 24 are formed on the substrate 20. Here, it is sufficient that the first buffer layer 27 and the second buffer layer 28 may be optionally formed as necessary.

The first electrode layer 22 is formed by forming a film of a material constituting the first electrode layer 22 on a surface of the substrate 20 by, for example, a sputtering method. The material constituting the first electrode layer 22 is as described above. The sputtering method may be a direct current (DC) sputtering method or a radio frequency (RF) sputtering method. Furthermore, the first electrode layer 22 may be formed by using a chemical vapor deposition (CVD) method, an atomic layer deposition (ALD) method, or the like, instead of the sputtering method.

The photoelectric conversion layer 26 is formed by forming a film on the first electrode layer 22. In a specific example, the photoelectric conversion layer 26 is formed by, for example, forming a thin film precursor layer on the first electrode layer 22 and chalcogenizing the precursor layer.

Examples of the method for forming the precursor layer on the first electrode layer 22 include a sputtering method, a vapor deposition method, and an ink coating method. The vapor deposition method is a method of forming a film by heating a vapor deposition source and using an atom or the like that has become a gas phase. The ink coating method is a method in which a powdered material of a precursor film is dispersed in a solvent such as an organic solvent and is applied, and then the solvent is evaporated to form a precursor layer.

When the CIS-based photoelectric conversion layer 26 is formed, the precursor layer contains a group I element and a group III element. For example, the precursor layer may contain Ag as a group I element. Group I elements other than Ag included in the precursor layer can be selected from copper, gold, and the like. The group III element included in the precursor can be selected from indium, gallium, aluminum, and the like. The precursor layer may contain an alkali metal such as Li, Na, K, Rb, or Cs. Furthermore, the precursor layer may contain tellurium as a group VI element, in addition to selenium and sulfur.

In a case of forming the CIS-based photoelectric conversion layer 26, in a chalcogenization treatment of the precursor layer, the precursor layer containing a group I element and a group III element is subjected to a heat treatment in an atmosphere containing a group VI element, to be chalcogenized, thereby forming the photoelectric conversion layer 26.

For example, first, selenization by a vapor phase selenization method is performed. The selenization is performed by heating the precursor layer in an atmosphere of a selenium source gas (for example, hydrogen selenide or selenium vapor) containing selenium as a group VI element source. Although not particularly limited, the selenization is preferably performed, for example, at a temperature within a range of 300° C. or more and 600° C. or less in a heating furnace.

As a result, the precursor layer is converted into a compound (photoelectric conversion layer 26) containing a group I element, a group III element, and selenium. The compound (photoelectric conversion layer 26) containing a group I element, a group III element, and selenium may be formed by a method other than the gas phase selenization method. For example, such a compound can also be formed by a solid-phase selenization method, a vapor deposition method, an ink application method, an electrodeposition method, or the like.

Next, the photoelectric conversion layer 26 containing a group I element, a group III element, and selenium is sulfurized. The sulfurization is performed by heating the photoelectric conversion layer 26 in an atmosphere of a sulfur-containing sulfur source gas (for example, hydrogen sulfide or sulfur vapor). As a result, the photoelectric conversion layer 26 is converted into a compound containing a group I element, a group III element, and selenium and sulfur as a group VI element. In a surface portion of the photoelectric conversion layer 26, the sulfur source gas plays a role of substituting with sulfur, selenium in a crystal containing a group I element, a group III element, and selenium, for example, a chalcopyrite crystal.

Although not particularly limited, sulfurization is preferably performed, for example, at a temperature within a range of 450° C. or more and 650° C. or less in a heating furnace.

On the other hand, when the CZTS-based photoelectric conversion layer 26 is formed, the precursor layer is formed as a thin film of Cu—Zn—Sn or Cu—Zn—Sn—Se—S. Then, in the chalcogenization treatment of the precursor layer, the precursor layer containing Cu, Zn, and Sn is sulfurized and selenized in a hydrogen sulfide atmosphere and a hydrogen selenide atmosphere at 500° C. to 650° C. Thus, the CZTS-based photoelectric conversion layer 26 having $Cu_2ZnSn(S,Se)_4$ can be formed.

With the above-described chalcogenization treatment of the precursor layer, the first buffer layer 27 containing a VI group compound such as $Mo(Se,S)_2$ is formed between the first electrode layer 22 and the photoelectric conversion layer 26. The first buffer layer 27 has cleavability as described above.

The second buffer layer 28 is formed on the photoelectric conversion layer 26 by a method such as a chemical bath deposition (CBD) method, a sputtering method, a CVD method, or an ALD method. The material constituting the second buffer layer 28 is as described above.

The second electrode layer 24 is formed on the second buffer layer 28 by a method such as a sputtering method, a CVD method, or an ALD method. Alternatively, when the second buffer layer 28 is not present, the second electrode layer 24 is formed on the photoelectric conversion layer 26. The material constituting the second electrode layer 24 is as described above.

Next, the collecting electrode 30 (the first portion 31 and the second portion 32) is formed on the second electrode layer 24. The collecting electrode 30 can be formed by, for example, applying a printing process such as an inkjet method or a screen printing method in addition to a sputtering method, a CVD method, an ALD method, an AD method, and a vapor deposition method.

Next, the wiring 50 containing a conductive metal is joined to the collecting electrode 30. The wiring 50 may be, for example, the interconnector 52 and/or the connector 54 described above. An end portion of the interconnector 52 is placed, followed by joining of the interconnector 52 to the solar cell.

Joining of the wiring 50 can be performed by melt joining, liquid phase joining, solid phase joining (friction stir welding), or the like. In one example, the wiring 50 can be joined by a parallel gap welding method. Although not particularly limited, welding conditions may be, for example, a set voltage of 0.5 V to 1.5 V, a welding current of 50 A to 200 A, and a welding time of 50 msec to 150 msec.

In the above-described manufacturing process, the collecting electrode 30 is formed to have the above-described thickness. Specifically, the thickness D of the collecting electrode 30 at least at the joint portion between the collecting electrode 30 and the wiring 50 may be, for example, 4 μm or more, preferably 5 μm or more, more preferably 5.7 μm or more, still more preferably 12 μm or more, and most preferably 14 μm or more. More preferably, the thickness D of the collecting electrode 30 may be 17 μm or more. In addition, the thickness D of the collecting electrode 30 at least at the joint portion between the collecting electrode 30 and the wiring 50 may be, for example, 50 μm or less, and preferably 30 μm or less.

Here, voids may be generated in each layer in any or all of the processes of film formation described above. These voids are expanded by heat applied after film formation, that is, heat generated at the time of joining the wiring 50, and thus, there is a possibility that adhesion of each layer is reduced. In particular, since the layer having cleavability, that is, the first buffer layer 27 in the above-described example has lower adhesion than other layers, the adhesion may be further reduced due to the influence of voids.

In the method described above, since the thickness D of the collecting electrode 30 at the joint portion between the collecting electrode 30 and the wiring 50 is relatively large as described above, heat at the time of joining the wiring 50 is less likely to be conducted to other layers constituting the photoelectric conversion element 10, particularly to the photoelectric conversion layer 26 and the first buffer layer 27. Therefore, expansion of voids in each layer and a decrease in adhesion strength of each layer associated therewith can be suppressed.

Experimental Example

Next, an experimental example of the photoelectric conversion element 10 will be explained. First, the photoelectric conversion element 10 described above is prepared. In the photoelectric conversion element 10 according to the experimental example, the substrate 20 comprises titanium. The first electrode layer 22 comprises molybdenum. The first buffer layer 27 includes a group VI compound layer containing $Mo(Se,S)_2$. The photoelectric conversion layer 26 is a CIS type layer containing a chalcogen semiconductor containing a chalcogen element. The second electrode layer 24 is a transparent conductive film.

The collecting electrode 30 (the first portion 31 and the second portion 32) is constructed by a laminated body of a nickel layer and an aluminum layer. The nickel layer is provided in contact with the second electrode layer 24. A thickness of the nickel layer is 10 nm. Thicknesses of the aluminum layers in Experimental Examples 1 to 5 were 1.0 μm, 5.7 μm, 8.2 μm, 17.1 μm, and 26.2 μm, respectively. Assuming that the significant figure is in the order of 0.1 μm, each of a thickness of the entire collecting electrodes 30 is as described in Table 1 below in Experimental Examples 1 to 5.

The joining of the wiring (silver foil) 50 to the collecting electrode 30 was performed by melt joining. The welding conditions were a set voltage of about 0.90 V to 0.95 V, a welding current of about 80 A to 90 A, and a welding time of about 90 msec.

For the photoelectric conversion element 10 in the experimental example, an experiment on a relationship between a thickness of the wiring 50 and a tensile strength was performed. Specifically, an adhesion strength of the layer constituting the photoelectric conversion element 10 was evaluated by the following method. First, a tip of the interconnector after welding of the wiring is caught with a jig, and the tip of the interconnector is pulled upward at a speed of 5 mm/min in a direction of 45 degrees using an autograph device. Then, a tensile strength (maximum strength) at the time when the interconnector was detached from a joint portion between the wiring and the second electrode layer 24 was measured.

Figure 3:
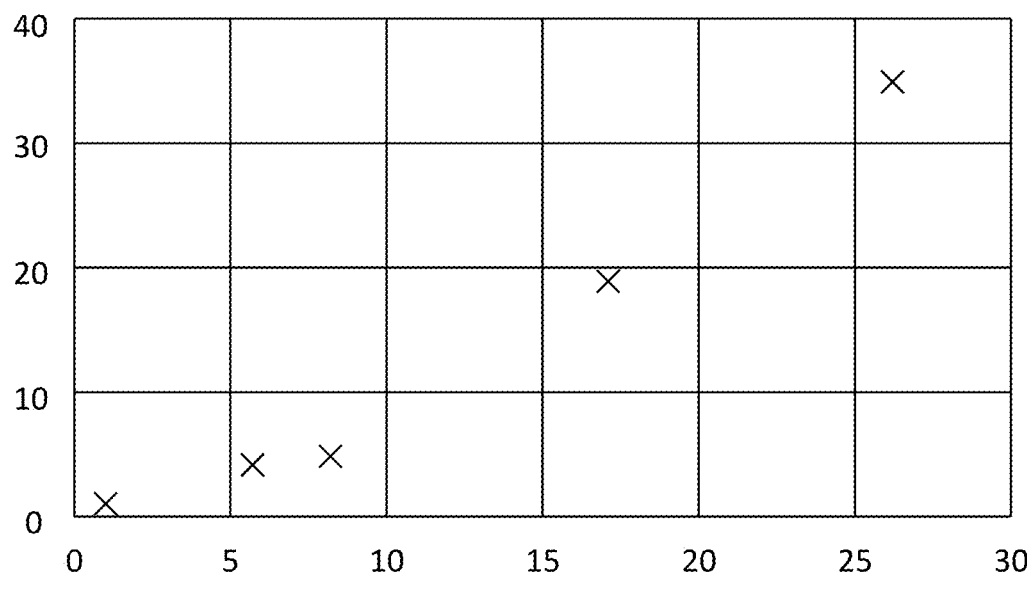
FIG. 3 is a graph showing a relationship between a thickness of a wiring and a tensile strength of a photoelectric conversion element.

The measured tensile strengths are shown in Table 1 and FIG. 3 below. FIG. 3 is a graph showing a relationship between a thickness of a wiring and a tensile strength of a photoelectric conversion element. Table 1 and FIG. 3 show the ratio of the tensile strength expressed by normalizing the test result (tensile strength) in Experimental Example 1 to "1".

TABLE 1

| | Thickness of Collecting Electrode (μm) | Ratio of Tensile Strength |
|---|---|---|
| Experimental Example 1 | 1.0 | 1 (reference level) |
| Experimental Example 2 | 5.7 | 4.1 |
| Experimental Example 3 | 8.2 | 4.8 |
| Experimental Example 4 | 17.1 | 18.9 |
| Experimental Example 5 | 26.2 | 34.9 |

As a result of the above experiment, it was found that the tensile strength remarkably increased as the thickness of the collecting electrode 30 increased. This is considered to be because the thickness of the collecting electrode 30 increases, and heat at the time of joining wirings is less likely to be conducted to the photoelectric conversion layer 26, the first buffer layer 27, and the second buffer layer 28.

A tendency shown in FIG. 3 suggests that the tensile strength in the collecting electrode 30 having the thickness of about 4 μm to 5 μm is several times as large as the tensile strength in the collecting electrode 30 having the thickness of 1.0 μm. In particular, the tensile strength in the collecting electrode 30 having the thickness of 5.7 μm is 4 times as large as the tensile strength in the collecting electrode 30 having the thickness of 1.0 μm.

Furthermore, it can be seen that the tensile strength can rapidly increase when the thickness of the collecting electrode 30 is in a range of 8 μm to 17 μm (see FIG. 3). It is considered that the tensile strength when the thickness of the collecting electrode 30 is, for example, about 12 μm to 14 μm exceeds about 10 times the tensile strength when the thickness of the collecting electrode 30 is 1.0 μm.

Note that, in this experiment, it was found that when the interconnector was detached, the photoelectric conversion element 10 was peeled off at a portion of the first buffer layer 27, that is, at the layer having cleavability and having a hexagonal crystal structure. Through the above experiments, a novel finding was found that the strength (adhesion strength) of the layer constituting the photoelectric conversion element 10 changes depending on the thickness of the collecting electrode 30. The thickness of the collecting electrode 30 described above is selected based on such a novel finding. From such a viewpoint, the present invention can be suitably used for a photoelectric conversion element including a layer having cleavability, particularly a photoelectric conversion element including a chalcogen semiconductor containing a chalcogen element.

In the above-described embodiments and experimental examples, the photoelectric conversion element 10 includes the wiring 50 joined to the collecting electrode 30. Instead of the wiring 50, an arbitrary conductor may be joined to the collecting electrode 30. Examples of such a conductor include a metal material such as solder for joining to another photoelectric conversion element 10, a conductor substrate provided in another photoelectric conversion element 10, and the like. In this case, it is sufficient that at least, the thickness of the collecting electrode 30 at the joint portion between the collecting electrode 30 and the conductor is, for example, 4 μm or more, preferably 5 μm or more, more preferably 5.7 μm or more, still more preferably 12 μm or more, and most preferably 14 μm or more. Even in this case, the heat at the time of joining the conductor and the collecting electrode 30 is less likely to be conducted to the photoelectric conversion layer 26, the first buffer layer 27, or the second buffer layer 28, so that it is possible to suppress a decrease in a tensile strength of the collecting electrode 30.

Figure 4:
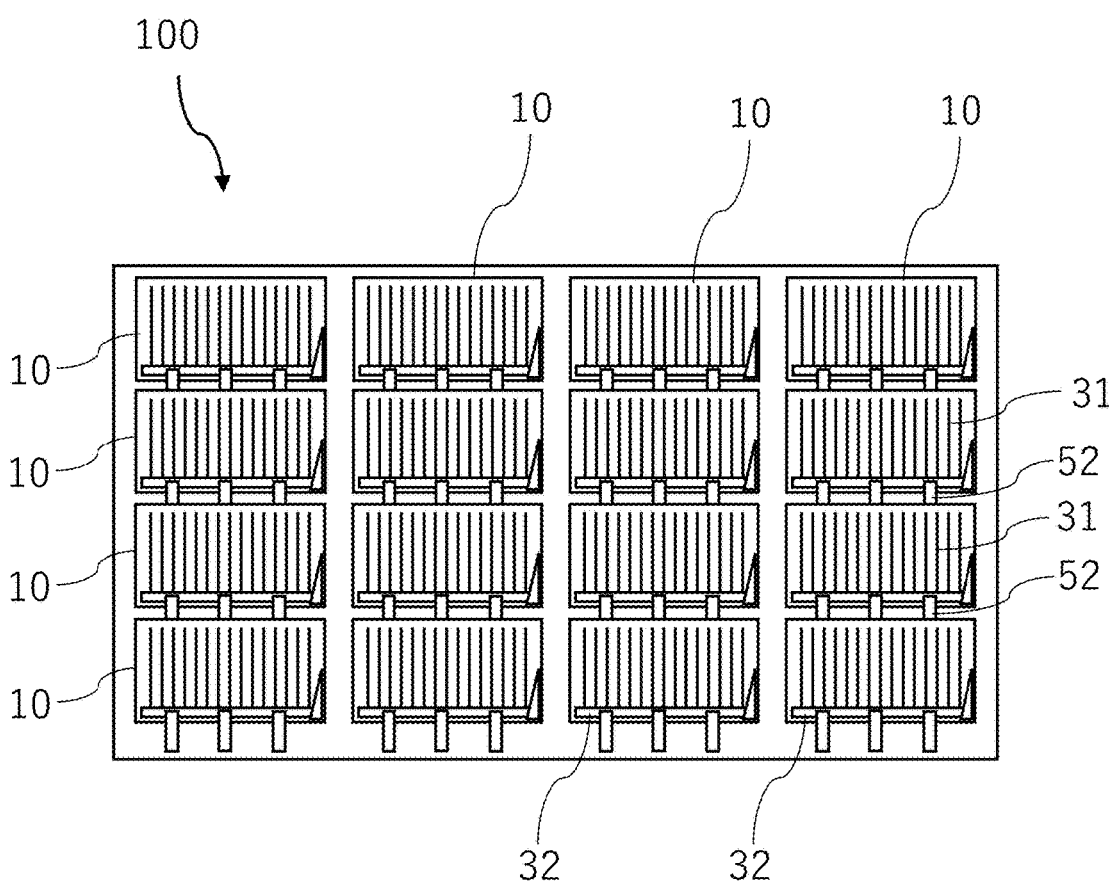
FIG. 4 is a schematic plan view of a solar cell module including a photoelectric conversion element.

Next, a solar cell module including a photoelectric conversion element will be described. FIG. 4 is a schematic plan view of a solar cell module including a photoelectric conversion element. A solar cell module 100 may include one or a plurality of photoelectric conversion elements 10. Note that FIG. 4 illustrates the photoelectric conversion module 100 including a plurality of photoelectric conversion elements 10. The one or the plurality of photoelectric conversion elements 10 may be sealed with, for example, a sealing material.

When the photoelectric conversion module 100 includes the plurality of photoelectric conversion elements 10, the plurality of photoelectric conversion elements 10 may be disposed in at least one direction, and preferably may be disposed in a lattice pattern. In this case, the plurality of photoelectric conversion elements 10 may be electrically connected to each other in series and/or in parallel.

In the example illustrated in FIG. 4, the photoelectric conversion elements 10 adjacent to each other are disposed at intervals. The photoelectric conversion modules 100 adjacent to each other may be electrically connected to each other by the wiring 50, specifically, the above-described interconnector 52. In this case, the interconnector 52 may extend across the photoelectric conversion modules 100 adjacent to each other.

Instead of the aspect illustrated in FIG. 4, the photoelectric conversion elements 10 adjacent to each other may be disposed so as to be partially overlapped each other. Specifically, a certain photoelectric conversion element 10 may be disposed so as to cover the second portion 32 of the collecting electrode 30 of the photoelectric conversion element 10 adjacent thereto. In this case, the photoelectric conversion element 10 is electrically connected to the second portion 32 of the collecting electrode 30 of the photoelectric conversion element 10 adjacent thereto via a conductor such as solder.

Figure 5:
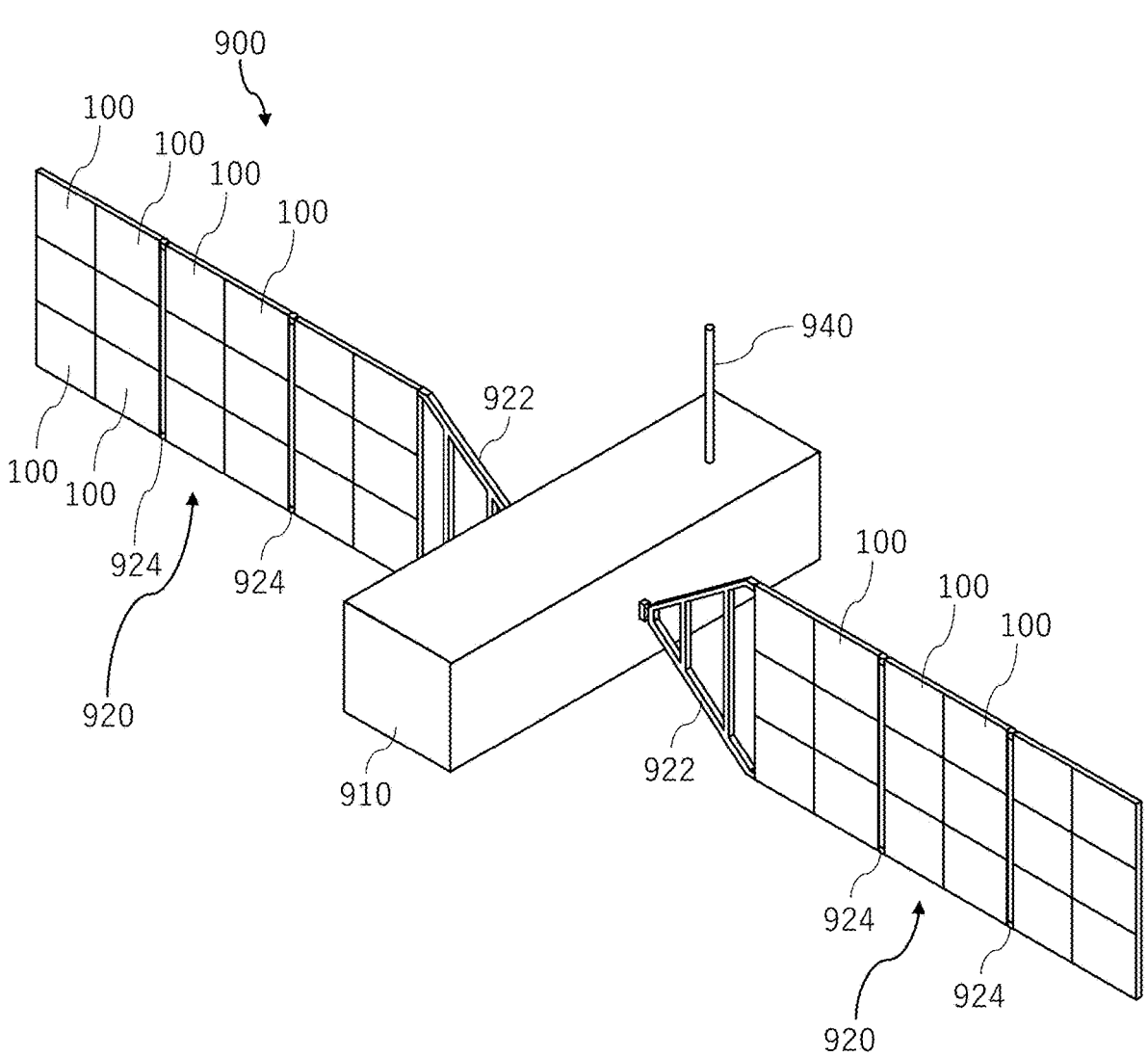
FIG. 5 is a schematic perspective view of an artificial satellite including a solar cell module.

Next, an artificial satellite including a solar cell module, and a paddle for an artificial satellite will be described. FIG. 5 is a schematic perspective view of an artificial satellite including a solar cell module. An artificial satellite 900 may have a base 910 and a paddle 920. The base 910 may include a device (not illustrated) necessary for controlling the artificial satellite 900 and the like. An antenna 940 may be attached to the base 910.

The paddle 920 may include the solar cell module 100 described above. The paddle 920 including the solar cell module 100 can be used as a power supply for operating various devices provided on the base 910. As described above, the solar cell module 100 can be applied to a paddle for an artificial satellite. In particular, since the paddle 920 for an artificial satellite is exposed to a high temperature environment and a severe temperature change environment at the time of launching and operating the artificial satellite, it is desirable to use the solar cell module 100 including the photoelectric conversion element 10 having high resistance to the temperature change described above.

The paddle 920 may have a connection portion 922 and a hinge portion 924. The connection portion 922 corresponds to a portion connecting the paddle 920 to the base 910.

The hinge portion 924 extends along one direction, and the paddle 920 can be bent with the hinge portion 924 as a rotation axis. Each paddle 920 may have at least one, preferably a plurality of, hinges 924. Thus, the paddle 920 including the solar cell module 100 is configured to be foldable small. When the artificial satellite 900 is launched, the paddle 920 may be in a folded state. It is sufficient that the paddle 920 is unfolded when receiving sunlight to generate power.

Instead of the structure as illustrated in FIG. 5, the paddle 920 may have a cylindrical shape formed by being wound. Accordingly, the paddle 920 can take a substantially flat unfolded state by a rotation of the wound portion. When the artificial satellite 900 is launched, the paddle 920 may maintain a generally cylindrical shape. It is sufficient that the paddle 920 is unfolded so as to be in a substantially flat state when receiving sunlight to generate power.

As described above, the contents of the present invention have been disclosed through the embodiments, but it should not be understood that the description and the drawings constituting a part of the disclosure limit the present invention. From this disclosure, various alternative embodiments, examples, and operational techniques will become apparent to those skilled in the art. Therefore, the technical scope of the present invention is defined only by the matters specifying the invention according to the claims appropriate from the above description.

In the embodiment described above, the second electrode layer 24 may be constituted by a transparent electrode layer. Alternatively, the first electrode layer 22 may be constituted by a transparent electrode layer. In this case, the second electrode layer 24 may be constituted by a transparent electrode layer or an opaque electrode layer.

In addition, in the present embodiment, the thin-film photoelectric conversion element has been described as an example, but the present invention is not limited thereto, and can be applied to a crystalline photoelectric conversion element as much as possible. Even in the crystalline photoelectric conversion element, an influence of heat applied to the element at the time of joining the conductor such as the wiring 50 can be alleviated by setting the thickness of the collecting electrode 30 as described above.

This application claims priority based on Japanese Patent Application No. 2021-107135 filed on Jun. 28, 2021, the entire contents of which are incorporated herein by reference.

The invention claimed is:

1. A photoelectric conversion element comprising, in this order:

a photoelectric conversion layer;

an electrode layer adjacent to the photoelectric conversion layer;

a collecting electrode adjacent to the electrode layer; and a conductor joined to the collecting electrode, wherein a thickness of the collecting electrode at least at a joint portion between the collecting electrode and the conductor is 4 μm or more, the collecting electrode includes a plurality of line-like first portions and a second portion extending in one direction, the second portion is directly connected to the plurality of line-like first portions, and the conductor is joined to the second portion and extends in a direction intersecting said one direction.

2. The photoelectric conversion element according to claim 1, wherein the thickness is 12 μm or more.

3. The photoelectric conversion element according to claim 1, wherein the joint portion between the collecting electrode and the conductor is provided at a position overlapping the photoelectric conversion layer when viewed from a direction orthogonal to an interface of the photoelectric conversion layer.

4. The photoelectric conversion element according to claim 1, wherein a material constituting the collecting electrode comprises at least one of indium tin oxide, indium titanium oxide, indium zinc oxide, tin zinc doped indium oxide, tungsten doped indium oxide, hydrogen doped indium oxide, indium gallium zinc oxide, zinc tin oxide, fluorine doped tin oxide, aluminum doped zinc oxide, boron doped zinc oxide, gallium doped zinc oxide, Ni, Ti, Cr, Mo, Al, Ag, and Cu.

5. The photoelectric conversion element according to claim 1, comprising a layer having a hexagonal crystal structure.

6. The photoelectric conversion element according to claim 1, wherein the photoelectric conversion layer includes a chalcogen semiconductor containing a chalcogen element.

7. The photoelectric conversion element according to claim 1, wherein the conductor is a wiring.

8. A solar cell module comprising the photoelectric conversion element according to claim 1.

9. A paddle comprising the solar cell module according to claim 8.

10. A method for manufacturing a photoelectric conversion element comprising:

forming a photoelectric conversion layer;

forming an electrode layer adjacent to the photoelectric conversion layer;

forming a collecting electrode adjacent to the electrode layer, the collecting electrode being provided with a plurality of line-like first portions and a second portion extending in one direction, the second portion being directly connected to the plurality of line-like first portions; and joining a conductor to the second portion of the collecting electrode so as to extend in a direction intersecting said one direction, in this order, wherein a thickness of the collecting electrode at least at a joint portion between the collecting electrode and the conductor is 4 μm or more.

11. The photoelectric conversion element according to claim 1, wherein the conductor is melt joining directly to the collecting electrode.

12. The photoelectric conversion element according to claim 6, comprising:

a first electrode layer; and a first buffer layer between the photoelectric conversion layer and the first electrode layer, wherein the first buffer layer includes Mo $(Se, S)_2$ layer, $MoSe_2$ layer, $MoS_2$ layer, or $Cr_xTaS_2$ layer.

13. The photoelectric conversion element according to claim 1, wherein the collecting electrode comprises a laminate including:

a nickel layer in contact with the electrode layer; and an aluminum layer on the nickel layer.

14. The method for manufacturing a photoelectric conversion element according to claim 12, wherein the conductor is melt joining directly to the collecting electrode.

* * * * *